United States Patent [19]

Saia et al.

[11] 4,444,618

[45] Apr. 24, 1984

[54] PROCESSES AND GAS MIXTURES FOR THE REACTIVE ION ETCHING OF ALUMINUM AND ALUMINUM ALLOYS

[75] Inventors: Richard J. Saia, Scotia; Bernard Gorowitz, Clifton Park, both of N.Y.

[73] Assignee: General Electric Company, Schenectady, N.Y.

[21] Appl. No.: 471,617

[22] Filed: Mar. 3, 1983

[51] Int. Cl.³ .......................... C23F 1/02; B44B 1/22; C03C 15/00; C03C 25/06

[52] U.S. Cl. ............................. 156/643; 156/626; 156/646; 156/656; 156/659.1; 156/665; 204/192 E; 252/79.1

[58] Field of Search ............... 156/643, 646, 651, 656, 156/659.1, 665, 345, 626; 204/164, 192 E, 298; 252/79.1; 427/38, 39

[56] References Cited

U.S. PATENT DOCUMENTS

| | | | |
|---|---|---|---|
| 4,267,013 | 5/1981 | Iida et al. | 156/646 X |
| 4,350,563 | 9/1982 | Takada et al. | 156/643 |
| 4,352,724 | 10/1982 | Sugishima et al. | 204/192 E |
| 4,380,488 | 4/1983 | Reichelderfer et al. | 156/643 |

Primary Examiner—William A. Powell
Attorney, Agent, or Firm—Paul E. Rochford; James C. Davis, Jr.; James Magee, Jr.

[57] ABSTRACT

A method and gas mixture of boron trichloride, carbon tetrachloride and oxygen useful for the reactive ion etching of aluminum and aluminum alloys to form metallizations for microelectronic devices and circuits is provided. The method and gas mixture provide consistent induction periods, high etch rates, high selectivity between photoresist and silicon dioxide, and minimal loading effects with good dimensional control. Also provided is a two step, two gas mixture process particularly useful in preventing linewidth loss due to excessive resist erosion during long overetches wherein the boron trichloride, carbon tetrachloride and oxygen gas mixture is used for etching and subsequently a boron trichloride-oxygen gas mixture is used for the overetch.

21 Claims, 7 Drawing Figures

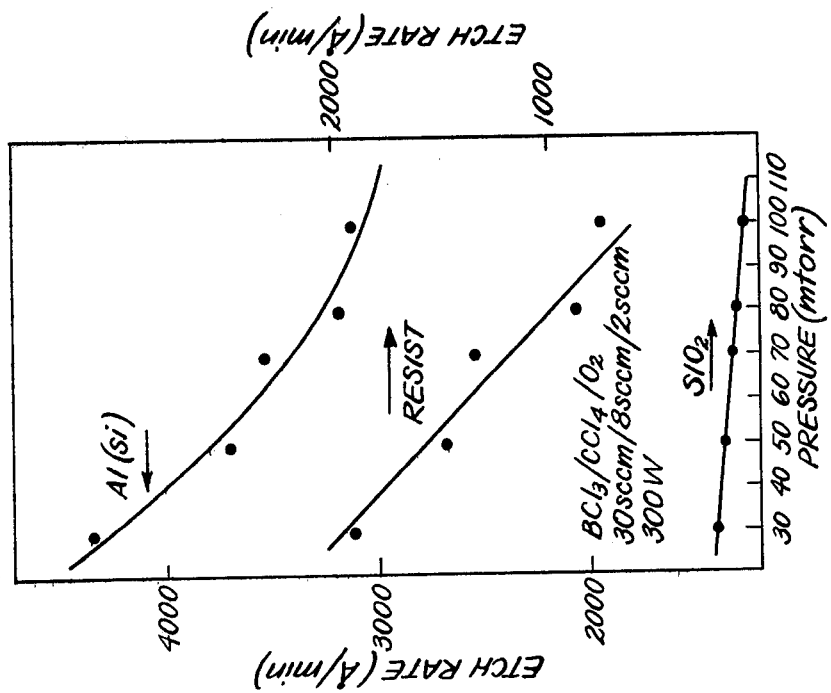
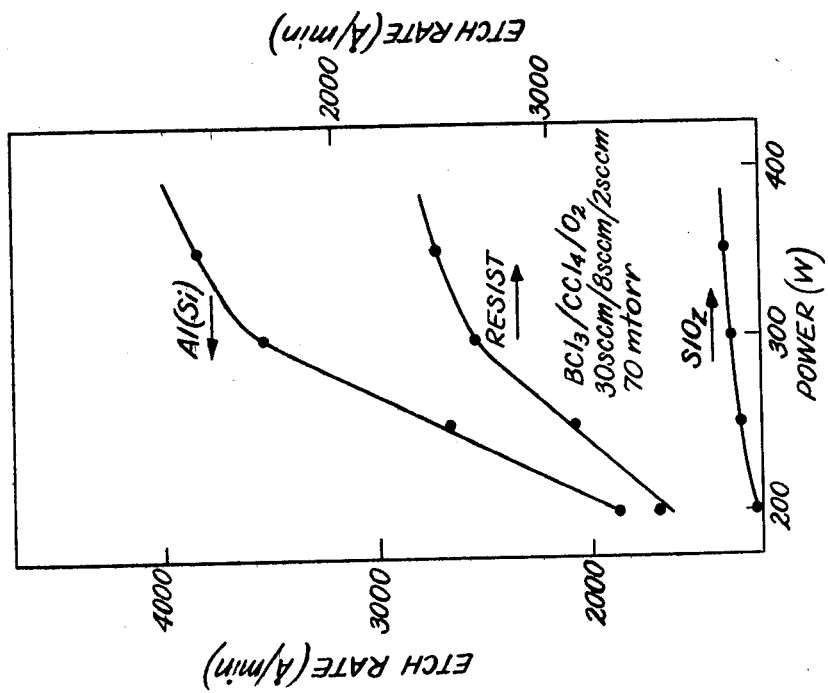

PROCESSES AND GAS MIXTURES FOR THE REACTIVE ION ETCHING OF ALUMINUM AND ALUMINUM ALLOYS

BACKGROUND OF THE INVENTION

The present invention relates to methods and gas mixtures for patterning aluminum and aluminum alloy layers in the manufacture of microelectronic devices and circuits. More particularly, the present invention relates to dry etching methods and gas mixtures for patterning aluminum and aluminum alloys by reactive ion etching.

Aluminum and aluminum alloys are popular and frequently used materials for the "metallizations" found in large scale integrated circuits. Such metallization is used, for example, as the interconnection layer on integrated circuits to make ohmic contact to the devices formed in the silicon and to connect the devices to bonding pads on the edge of the chips. Aluminum is used because it adheres well to both silicon and silicon dioxide, can be easily vacuum deposited due to its low boiling point and has high conductivity. In addition to pure aluminum, alloys of aluminum are used to form integrated circuit interconnections for different performance-related reasons. For example, small amounts of copper are added to reduce the potential for electromigration effects where current applied to the device induces transport of the aluminum. Small amounts of silicon also are added to aluminum metallization to minimize the possibility of electrical spiking that can occur in contact holes. In some cases, titanium is added for the same reason. Aluminum metallization layers may be vacuum-deposited onto semiconductor wafers or substrates by, for example, flash evaporation, filament evaporation, electron-beam evaporation, induction evaporation, and sputtering.

In order to form the patterned metallizations, a series of process steps are ordinarily practiced, e.g., depositing a layer of aluminum or aluminum alloy, coating a photoresist film onto the aluminum or aluminum alloy layer, creating in the photoresist film an image of the predetermined required pattern as by exposing selected portions of the photoresist film to light passing through a mask or grating, removing either the exposed or unexposed portions of the photoresist film depending upon the type of resist employed, and removing the aluminum or aluminum alloy layer in the regions not masked by the remaining photoresist film.

Wet etching, including the step of dipping the entire substrate into an etching solution, has been in general use for several years and is still generally satisfactory to the 4 micron ($\mu$m) level. With the trend toward smaller and smaller structures, i.e., 1 $\mu$m and smaller, with more and more devices per chip, wet etching is yielding to dry processing. Dry etching procedures, exemplified by plasma etching, offer improved resolution by lessening of line shrinkage due, for example, to undercutting. Other advantages of dry etching include less severe resist adherence requirements and relative ease of disposal of etchant byproducts.

Most of the dry etching of aluminum and aluminum alloys was and still is in many cases done in planar plasma, parallel plate etchers with carbon tetrachloride ($CCl_4$) as the main gas constituent. The gas pressure regime in which these etchers operate is typically from 0.1 to 1 torr. Since the mechanism of planar plasma etching involves primarily a chemical factor and, to a much lesser extent, an ion bombardment factor, a fair amount of lateral etching takes place. Because of this, the clearing of steep sidewalls is not a major problem, but extensive linewidth loss is normally observed. Other problems encountered with planar plasma etching include, for example, low aluminum etch rates, low selectivities to photoresist and $SiO_2$, and residue formation. Selectivity refers to the rate at which aluminum is desirably etched compared to the rate at which other materials, such as photoresist and $SiO_2$ are undesirably etched.

By very careful control of the process parameters, including chamber heating to reduce residue formation, successful planar plasma dry etching has been accomplished in the 2-3 $\mu$m range, but with critical dimension (CD) shifts of as much as 0.4 $\mu$m. However, with the advent of Very Large Scale Integration (VLSI), where aluminum in the 1 $\mu$m linewidth range must be etched, the large CD shifts typically obtained in planar plasma etchers become unacceptable.

Because of the limitations of planar plasma etchers, the focus of dry etching has shifted to reactive ion etching (RIE). The main impetus for the use of reactive ion etching technology is the potential for improvement in the anisotropic nature of the etch. Vertically etched layers are essential to preserving line-width integrity and providing increased device density. The added etch control and selectivity with RIE contributes to the quality of integrated circuits and devices. Reactive ion etching, operating in the pressure regime of 0.01 to 0.1 torr, with the wafers placed on a radio frequency powered cathode, combines chemical etching by active species with ion bombardment in a direction normal to the wafer surface to produce highly directional material removal.

Reactive ion etching of aluminum and aluminum alloys with $CCl_4$, however, has resulted in problems with the thermal stability of the resist, residues from polymer formation, incomplete grain boundary etching and incomplete silicon etching. Many process modifications have been tried including the use of super cooled substrates and inert gas dilutions of $CCl_4$ with helium or argon, but none of these methods has solved all of the etching problems.

Several investigators have reported good results for the reactive ion etching of aluminum with boron trichloride ($BCl_3$) as a major component in a gas mixture. When $BCl_3$ is used as a source of chlorine, polymer-like film formations sometimes associated with the use of halocarbons are not observed. Boron trichloride is also an effective reducing agent for aluminum oxide, and a scavenger of trace amounts of water vapor. Within limits, these properties can result in a more reproducible etch than can be obtained with carbon tetrachloride, for example, since the induction period, i.e., the time prior to the onset of aluminum etching, which is usually very short with $BCl_3$, is spent mainly in etching native aluminum oxides. Since $BCl_3$ plasmas etch aluminum relatively slowly, at rates of 400–500 Å/min., $BCl_3$ is not normally used without additives.

Additions of chlorine to $BCl_3$ plasmas can result in high etch rates, and a good quality aluminum etch if a proper gas ratio is used. Most of the reactant etching species in this type plasma are produced by the added chlorine. For batch etchers, however, this gas mixture may not be the best choice. Too much chlorine in the mixture results in isotropic etching and poor dimensional control, while too little chlorine results in reactant depletion and decreased etch rates, i.e., a large loading effect. It may be possible to tailor the gas ratios to a fixed wafer load, but if variable size loads are to be etched, the etching characteristics may also vary. The addition of $Cl_2$ to $BCl_3$, however, also causes native aluminum oxides to etch more slowly, resulting in longer induction periods.

When small amounts of oxygen, usually under 5%, are added to a $BCl_3$ plasma, aluminum etch rates can increase by as much as a factor of six. The oxygen reacts with $BCl_3$ in preference to aluminum, producing reactive chlorine species. Use of this plasma, however, results in poor critical dimension control, due to excessive resist loss and lateral etching. Higher fractions of oxygen, e.g. 10% or more, also cause the formation of particulates which are attributed to boron oxides.

The addition of carbon tetrachloride to $BCl_3$ is another means of introducing chlorine species. This combination results in higher aluminum etch rates with relatively high selectivity to photoresist, but residue formation on the oxide substrate is frequently a problem.

Thus, what is needed is a reactive ion etching process which rapidly etches the aluminum and aluminum alloys used to fabricate the metallizations for microelectronic circuits and devices, which has high selectivity to photoresists and $SiO_2$ and dimensional control compatible with 1 $\mu$m linewidths, but which has minimal loading effects (dependence of etch rate on total surface area to be etched) and short consistent induction periods.

SUMMARY OF THE INVENTION

The present invention provides a dry etching method and a three gas mixture of boron trichloride ($BCl_3$), carbon tetrachloride ($CCl_4$), and oxygen ($O_2$) for the reactive ion etching of aluminum and aluminum alloys used in the fabrication of microelectronic circuits. Most typically, the aluminum or aluminum alloys are in the form of thin films and the etching is performed to create predetermined patterns, i.e., metallizations, in the thin films. With this combination of gases, the reactive ion etching of aluminum and aluminum alloys is much improved over techniques existing heretofore, e.g., consistent induction periods, high etch rates, high selectivity between photoresist and silicon dioxide and minimal loading effects with good dimensional control are readily and consistently achieved.

Generally, the gases are provided as a mixture comprising, by volume, 2–6% $O_2$ and 15–25% $CCl_4$ with the balance being $BCl_3$. Preferably, the gases are provided as a mixture comprising, by volume, about 75% $BCl_3$, 20% $CCl_4$ and 5% $O_2$.

The method then, simply stated, is for the reactive ion etching of predetermined patterns in masked thin films of aluminum and aluminum alloys which comprises producing reactive species including ions from the $BCl_3/CCl_4/O_2$ gas mixture and directionally etching the thin films with the reactive species including the ions to selectively remove portions of the thin film thus forming the predetermined pattern as the remaining aluminum or aluminum alloy thin film. For microelectronic applications, the thin films may range in thickness of from several angstroms (Å) to several microns ($\mu$m) and frequently are not of uniform thickness. As a practical matter, the method of the invention is not limited by film thickness, rather other factors, such as the ability of the photoresist masking material and $SiO_2$ to withstand the reactive ion etching process, are the limiting factors.

Frequently, due to the anisotropy of the reactive ion etching process, it is necessary to perform overetching to ensure complete removal of the aluminum or aluminum alloy from the sidewalls especially if the metallic layer is of nonuniform thickness. Generally, use of the $BCl_3/CCl_4/O_2$ gas mixture during overetch is highly satisfactory. However, long overetches (greater than 40% of the etching time) with the $BCl_3/CCl_4/O_2$ gas mixture tend to produce linewidth loss due to excessive resist erosion.

Thus, there is provided a two step, two gas mixture method for the reactive ion etching of predetermined patterns in masked thin films of aluminum and aluminum alloys which comprises producing reactive species including ions from a $BCl_3/CCl_4/O_2$ gas mixture and directionally etching the thin film with the reactive species including the ions to selectively remove portions of the thin film until a predetermined endpoint is reached and the predetermined pattern is formed as the remaining aluminum or aluminum alloy thin film and thereafter producing reactive species including ions from a $BCl_3/O_2$ gas mixture and subjecting the pattern to an overetch period which removes any remaining aluminum or aluminum alloy material.

The changeover of gas mixtures may conveniently be accomplished by turning off the $CCl_4$ gas flow at the spectroscopic endpoint whereupon the resulting gas flow, preferably at 32 sccm, containing 2–6% $O_2$ by volume, balance $BCl_3$, preferably 6% $O_2$/94% $BCl_3$ by volume, is used for a 20 to 50% overetch period. The $BCl_3/CCl_4/O_2$ gas mixture produces an anisotropic etch with good selectivity over photoresist. The $BCl_3/O_2$ gas mixture produces a larger amount of lateral etching that cleans up steep sidewalls in the overetch. This lateral etching, and also the greater amount of photoresist loss cannot be tolerated for the entire etch without large critical dimension shifts. Using $BCl_3/O_2$ for just the overetch, does not cause any significant reduction in linewidth or undercutting.

BRIEF DESCRIPTION OF THE DRAWINGS

FIG. 1 shows the effect of power on the etching rates of Al(Si), resist and silicon dioxide in the 75% $BCl_3$/20% $CCl_4$/5% $O_2$ gas mixture at constant conditions of 40 sccm gas flow rate and 70 mtorr pressure;

FIG. 2 shows the effect of pressure on the etching rates of Al(Si), resist and silicon dioxide in the 75% $BCl_3$/20% $CCl_4$/5% $O_2$ gas mixture at constant conditions of 40 sccm gas flow rate and 300 watts power;

BCl₃/20% CCl₄/5% O₂ gas mixture for the etch and 40% overetch periods; and

Figure 7:
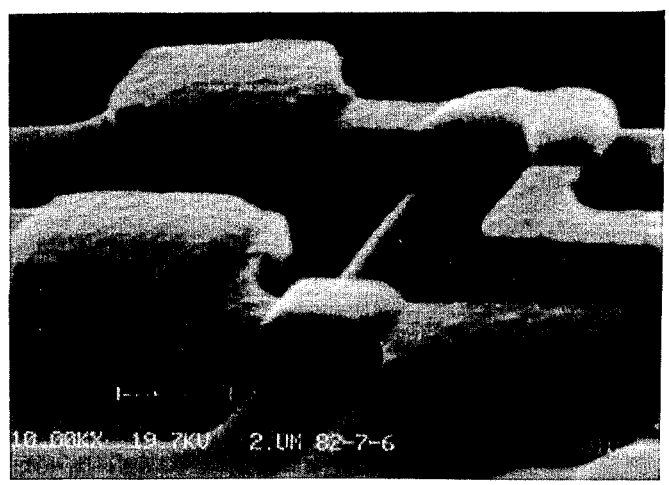

FIG. 7 is a scanning electron micrograph at 9750× of Al(Si) over steps of oxide covered polysilicon showing absence of residual hillocks following etching with the 75% BCl₃/20% CCl₄/5% O₂ gas mixture and subsequently with a 94% BCl₃/6% O₂ gas mixture for a 40% overetch in accordance with the method of the invention.

DESCRIPTION OF THE PREFERRED EMBODIMENT

As set forth in the foregoing summary, this invention relates to processes and gas mixtures for the reactive ion etching of aluminum and aluminum alloys to form metallizations for microelectronic devices and circuits.

As is generally understood in the semiconductor fabrication arts, plasma etching is that generic family of procedures in which substrate removal is primarily due to chemical reaction which is dependent upon reactant species in the plasma and not to momentum exchange. That is not to imply that no momentum exchange occurs in plasma etching processes for it is inherent that some momentum exchange occur due to the plasma field itself.

On the other hand are those procedures wherein substrate removal is one of momentum transfer between an ion and a target atom, variously referred to as ion milling, sputter etching, sputtering and ion beam milling, and generically as sputtering. Sputtering processes can be divided into two classes, i.e., physical ion etching (physical sputtering) wherein the bombarding ion is from an inert gas, versus chemical ion etching (chemical sputtering) wherein the bombarding ion is a reactive gas.

The method of the present invention, reactive ion etching, utilizes both chemical and physical sputtering. The reactivity of the ions that are formed is very high especially when chemical sputtering occurs. Using carbon tetrafluoride as an example, reactive ions of fluorine (negative charge) and trifluoromethane (positive charge) are formed in an electric field at low pressure, much the same as in ion-beam etching. These ions are accelerated and directed to the substrate, where they displace atoms through two processes, i.e., physical displacement, and (herein lies the difference between ion etching and reactive-ion etching) chemical reactions forming reaction by-products. This etching is typically performed in a parallel plate reactor and is essentially anisotropic, i.e., the largest amount of material removal takes place in a direction parallel to the path of flight of the ions.

In order to illustrate more fully, but not by any means to limit, the practice and novel features of the gas mixtures and processes of the present invention, the following examples are provided. Although illustrated with respect to aluminum nominally alloyed with one weight percent silicon, i.e., Al(Si) sometimes referred to as "Alusil", the invention herein is equally applicable to any of aluminum and aluminum alloys, especially aluminum-silicon alloys, that have heretofore been used as metallizing materials in the manufacture of microelectronic devices and circuits.

In the examples that follow the reactive ion etching equipment used was an Anelva Model 503. The Model 503 is manually loaded with a capability for etching eight three-inch diameter wafers per run or a lesser number of larger wafers. It does not contain a load lock, but is equipped with a cryo-pumped high vacuum system capable of reducing background pressures to the $10^{-6}$ torr range between runs. Gases are introduced circumferentially into the chamber with their flows maintained by Tylan mass flow controllers. A Roots blower backed by a mechanical pump is used to evacuate the etchant gas and volatile product load. System pressure is monitored by an MKS capacitance manometer whose output acts as a servo control for an electrically operated valve which maintains constant pressure over a range of gas flows.

Power, at a frequency of 13.56 MHz, is provided to planar electrodes of variable spacing in a stainless steel chamber having a volume of about 60 liters. The wafers being etched are placed on a 42 cm diameter, water cooled cathode, covered by a fused quartz disc containing holes to accommodate the wafers. The facing, grounded electrode is perforated in order to reduce backscatter of sputtered material. Average power densities were of the order of 0.25 W/cm².

With a non-load locked, manually loaded etcher, and etch products, e.g. AlCl₃, which are hygroscopic in nature, the humidity of the ambient air can play a major role in process reproducibility, particularly with respect to the induction period. Long induction periods result in increased resist erosion and occasionally non-uniform etching, not to mention reduced productivity. To reduce the effects of humidity, the chamber walls were heated to a temperature of 40° C. at all times to minimize deposition while etching, and also to help prevent the adsorption of water vapor upon loading and unloading. The cathode was also heated to 40° C. except during the etch period when it was cooled to about 20° C. This was accomplished using two independently controlled circulators, for rapid response. A short forming gas plasma (10% H₂ in N₂) was also run before and after each etch cycle to remove volatiles and possible post etch corrosion producing agents. Using these process steps, listed in the Table, ethcing results remained constant while the room relative humidity ranged from 10 to 65%.

| ALUMINUM ETCHING PROCESS SEQUENCE | | |
|---|---|---|
| Step | Gas Mixture | Cathode Temperature |
| (1) Wafer Loading | — | 40° C. |
| (2) Chamber Pre-Treatment | N₂/H₂ | 40° C. |
| (3) Al Etching | BCl₃/CCl₄/O₂ | 20° C. |
| (4) Overetch | BCl₃/CCl₄/O₂ or BCl₃/O₂ | 20° C. |
| (5) Chamber Post-Treatment | N₂/H₂ | 40° C. |
| (6) Wafer Unloading | — | 40° C. |

Primary diagnostic tools included measurements of the DC bias voltage across the electrodes and optical emission spectroscopy. The latter was performed by monitoring the plasma through a quartz window in the chamber wall using a scanning monochromator and photo-multiplier with peak sensitivity in the range of 200–700 nm.

The Al(Si) films that were etched were deposited by dc planar magnetron sputtering in a MRC Model 603 system. The photoresist used to delineate the patterns on the Al(Si) films was AZ 1470, a positive type photoresist manufactured and sold by the Shipley Co., USA.

Positive type photoresists are photoresists whose solubility in developer increases by light irradiation such as by ultraviolet rays or the like. The photoresist was not subjected to auxiliary post bakes or other "hardening" techniques.

EXAMPLE I

BCl$_3$ was used as the etchant for patterned Al(Si) films. At a BCl$_3$ flow rate of 30 standard cubic centimeters per minute (sccm), pressure of 70 mtorr and a power of 300 W (0.25 W/cm$^2$), the etch rate of Al(Si) was too slow to be practical (400 Å/min).

EXAMPLE II

The Model 503 was batch loaded and a mixture of BCl$_3$ and O$_2$ was used as the etchant. At a flow of 30 sccm BCl$_3$, and 2 sccm O$_2$ at 70 mtorr and 300 W, the etch rate of Al(Si) was 2800 Å/min. The etching was residue free, with no undercutting, but linewidth losses of up to 0.3 μm were obtained because of poor selectivity to photoresist. By means of the optical emission spectroscopy equipment, it was determined that the added O$_2$ increased the chlorine radical content in the plasma.

EXAMPLE III

Carbon tetrachloride (CCl$_4$), the etchant used in most planar plasma etchers for the etching of aluminum was added to BCl$_3$ as an alternate chlorine source. Mixtures of 30 sccm BCl$_3$ and 6 to 30 sccm CCl$_4$ were used as reactive ion etch gases for Al(Si) at 70 mtorr and 300 W. All of those mixtures, regardless of the CCl$_4$ flow in the 6–30 sccm range, etched Al(Si) at about 2000 Å/min, but left behind a polymer-type residue.

EXAMPLE IV

A mixture of BCl$_3$, CCl$_4$ and O$_2$ was introduced as the gas mixture for the reactive ion etching of Al(Si). With a flow rate of 30 sccm BCl$_3$, 8 sccm CCl$_4$ and 2 sccm O$_2$ at 70 mtorr, the power was varied from 200 to 350 watts. The optimum power for etching, as shown in FIG. 1, was about 300 W (0.25 W/cm$^2$). At this power, etch rates were in the order of 3500 Å/min, with selectivities of 2.6:1 and 28.0:1 over Shipley AZ 1470 photoresist and SiO$_2$, respectively.

The data of FIG. 1 were obtained while etching one wafer per run. With the chamber loaded to its full capacity of eight wafers with the process conditions unchanged, the Al(Si) etch rate was reduced by about 15%. Wafer to wafer uniformity operating at full capacity was about ±5%.

EXAMPLE V

In a series of experiments similar to those of Example IV, the pressure was varied from 30 to 100 mtorr with the results set forth in FIG. 2. The optimum pressure selected was 70 mtorr. At lower pressures photoresist crinkling was observed, probably due to overheating from excessive ion bombardment. At much higher pressures, polymer-type residues deposited in the chamber.

Figure 3:
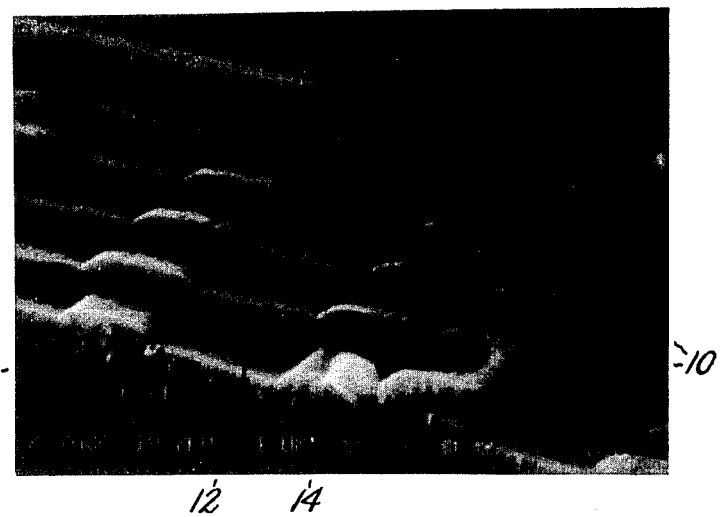
FIG. 3 is a scanning electron micrograph at 7500× of Al(Si) over steps of oxide covered polysilicon etched by the method of the invention with the 75% $BCl_3$/20% $CCl_4$/5% $O_2$ plasma.

A scanning electron micrograph at 7500× of a wafer etched at the optimum conditions found by Examples IV and V is shown in FIG. 3. It may be observed that the etching produced is anisotropic and residue free. The geometries etched are in the 1 to 1.5 μm range and critical dimension shifts (linewidth loss) of less than 0.1 to 0.2 μm were observed. In FIG. 3, metallizations 10 are shown traversing SiO$_2$ substrate 12 and stepping over lines of oxide covered polysilicon 14.

Figure 4:
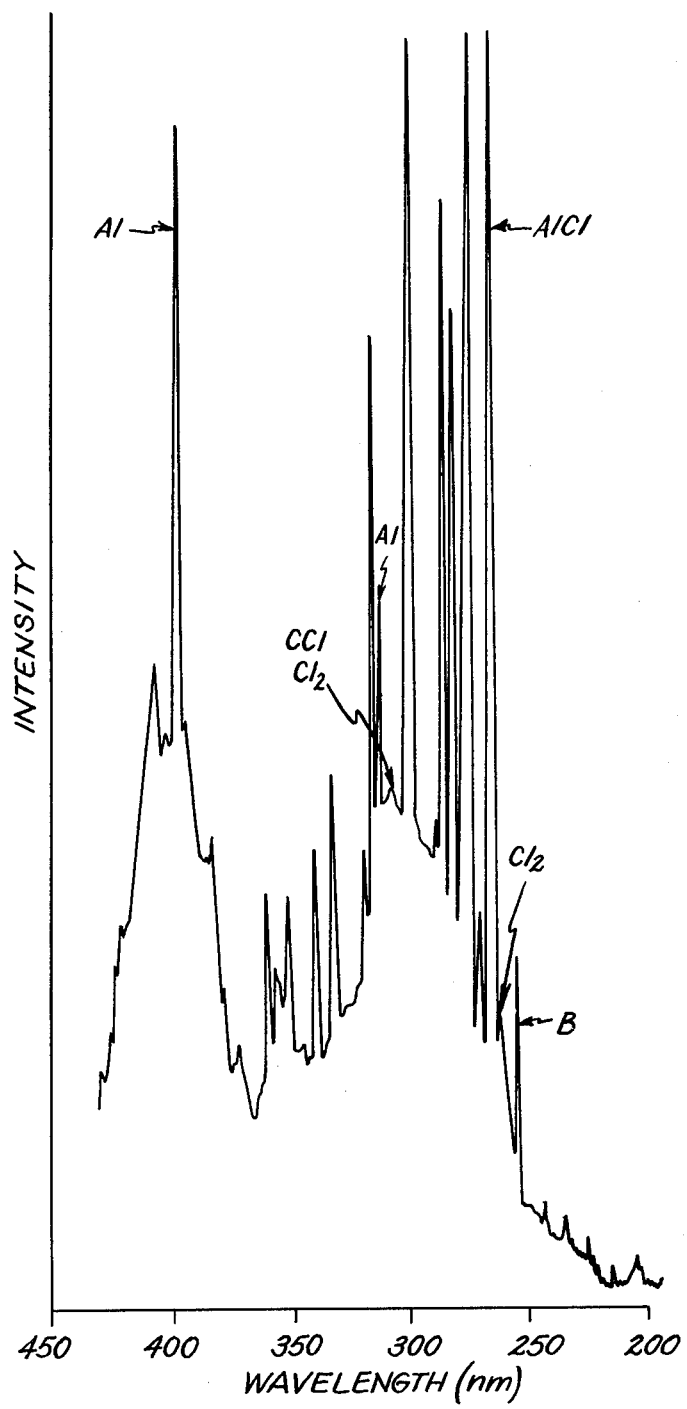
FIG. 4 is an optical emission spectrum of the 75% $BCl_3$/20% $CCl_4$/5% $O_2$ gas mixture during the etching of Al(Si) under the conditions of 40 sccm gas flow rate, 70 mtorr pressure, and 300 watts (0.25 $W/cm^2$) power.
Figure 5:
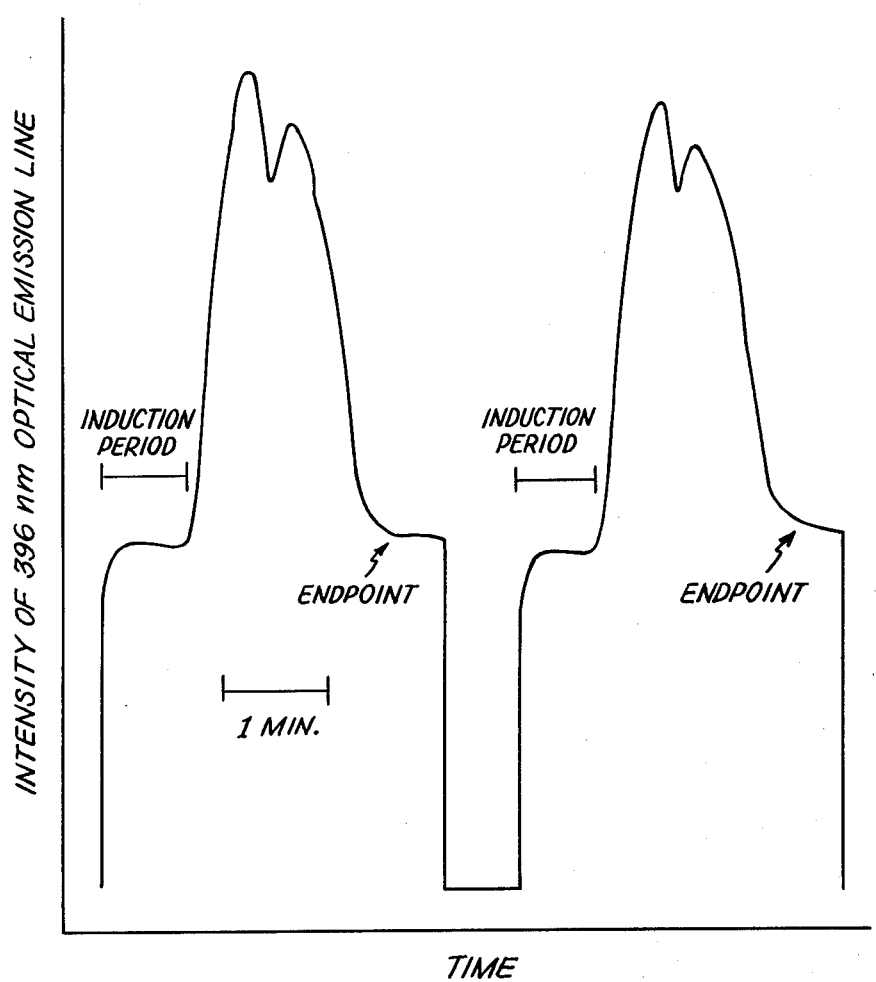
FIG. 5 is an intensity versus time characteristic of the 396 nm (Al) optical emission line during the etching of 3 inch diameter $SiO_2$ wafers having patterned Al(Si) thereon in successive runs by the method of the invention using the 75% $BCl_3$/20% $CCl_4$/5% $O_2$ gas mixture at a flow rate of 40 sccm, 70 mtorr pressure and 300 watts/power.

While etching aluminum coated wafers in the BCl$_3$/CCl$_4$/O$_2$ plasma as in Examples IV and V, an increase in the emission intensity of Al (396 and 308 nm) and AlCl (261 nm), the products of etching, were observed. At the same time, a decrease in the intensity of reactive chlorine species lines (256 and 305 nm) was detected as shown in FIG. 4. Any of these changes could theoretically be used for etching endpoint detection, although the most desirable signal seems to be that supplied by the 396 nm Al line. FIG. 5 shows a trace of a recorder output, monitoring the 396 nm Al emission line, while etching two 3 inch diameter patterned wafers, one at a time. The 45 sec induction period is typical in this non-load lock system. It is followed by a sharp increase in Al emission intensity and then a decrease at the clearing of the wafer substrate that can be used to trigger a preset overetch. A double peak was observed in this case since the Al(Si) was sputter deposited in two 4,000 Å passes, allowing a layer of native oxide to form between them.

With the BCl$_3$/CCl$_4$/O$_2$ gas mixture, it is possible to control the extent of lateral etching by taking advantage of the properties of each of the constituents. The CCl$_4$ was added in order to prevent linewidth erosion. With it, the etch is highly anisotropic. If there is a requirement to etch aluminum over very steep SiO$_2$ sidewalls, or if the aluminum includes large bumps or hillocks, there may be problems in clearing it from the substrate without very long over-etches which can result in excessive linewidth losses. As an option to a long overetch, a two-step, two gas mixture etching process has been invented which utilizes BCl$_3$/CCl$_4$/O$_2$ during the main etching period, and BCl$_3$/O$_2$ for the overetch period. This can be accomplished by simply stopping the CCl$_4$ flow at the spectroscopic endpoint, without switching off the rf power. The slightly isotropic nature of the BCl$_3$/O$_2$ plasma etch, results in enhanced sidewall clearing, rapid etching of Al(Si) bumps or hillocks, complete etching of silicon from Al(Si), and a reduction in the possibility of post etch corrosion, since some chlorocarbons are also sputtered away. This is accomplished with no significant additional linewidth loss during the over-etch period, which is typically 40% of the etch time, but may vary from about 20% to about 50% of the etch time.

EXAMPLE VI

Figure 6:
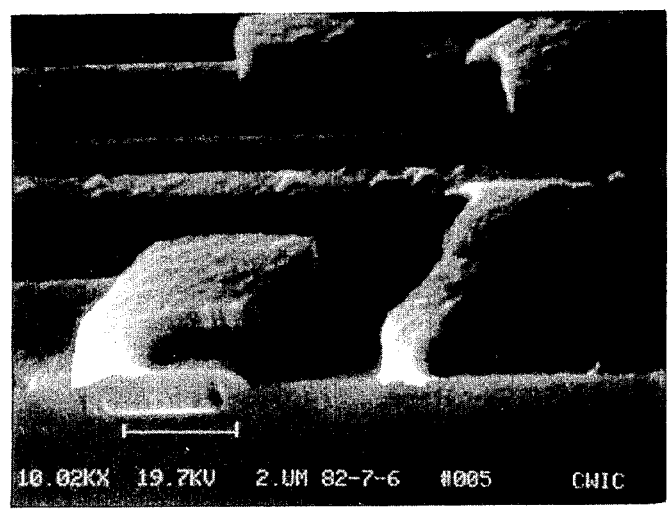
FIG. 6 is a scanning electron micrograph at 9750× of Al(Si) over steps of oxide covered polysilicon with hillocks that did not completely etch using the 75%

Wafers coated with 8000 Å of Al(Si) having a large grain structure and traversing steep steps of oxide-covered polysilicon were reactive ion etched using the BCl$_3$/CCl$_4$/O$_2$ gas mixture in the preferred ratios at the preferred gas flow rate of 40 sccm. FIG. 6 is a scanning electron micrograph at 9750× of a wafer etched using BCl$_3$/CCl$_4$/O$_2$ for both the etching period and a 40% overetch, which shows that neither the steep sidewalls were completely cleared of Al(Si) nor were the hillocks removed.

EXAMPLE VII

A wafer with the same prior processing history as the one described in Example VI, was similarly etched except that when the spectroscopic endpoint was reached, the CCl$_4$ flow was turned off and a 94% BCl$_3$/6% O$_2$ by volume gas mixture at 32 sccm was used for the 40% overetch. FIG. 7 is a scanning electron micrograph at 9750× of this wafer following completion of the procedures of this example which shows complete cleaning of the steep sidewalls and removal of the hillocks.

Finally, it is to be understood that the above-described techniques are only illustrative of the principles of the present invention. In accordance with these principles, numerous modifications and alternatives may be devised by those skilled in the art without departing from the spirit and scope of the invention.

What is claimed is:

1. A gas mixture for the reactive ion etching of aluminum and aluminum alloys comprising, by volume, 2–6% oxygen and 15–25% carbon tetrachloride with the balance being boron trichloride.

2. The gas mixture of claim 1 comprising, by volume, 75% boron trichloride, 20% carbon tetrachloride and 5% oxygen.

3. A method for the reactive ion etching of predetermined patterns in masked thin films of aluminum and aluminum alloys which comprises producing reactive species including ions from a gas mixture comprising by volume, 2–6% $O_2$ and 15–25% $CCl_4$ with the balance being $BCl_3$ and directionally etching the masked thin film with said respective species including ions to selectively remove the unmasked portion of said thin film thereby forming said predetermined pattern as the remaining masked aluminum or aluminum alloy thin film.

4. The method of claim 3 wherein said gas mixture comprises, by volume, 75% $BCl_3$, 20% $CCl_4$ and 5% $O_2$.

5. A method for the reactive ion etching of predetermined patterns in masked thin films of aluminum and aluminum alloys which comprises producing first reactive species including ions from a gas mixture comprising boron trichloride, carbon tetrachloride and oxygen and directionally etching the masked thin film with said first reactive species including ions for an etching time period to selectively remove the unmasked portions of said thin film thereby forming said predetermined pattern as the remaining masked aluminum or aluminum alloy thin film and thereafter producing second reactive species including ions from a gas mixture comprising boron trichloride and oxygen and subjecting said pattern to said second reactive species including ions for an overetching time period of from 20 to 50% of said etching time period.

6. The method of claim 5 wherein said boron trichloride, carbon tetrachloride and oxygen gas mixture comprises, by volume, 2–6% $O_2$, 15–25% $CCl_4$ with the balance being $BCl_3$.

7. The method of claim 6 wherein said gas mixture comprises, by volume, 75% $BCl_3$, 20% $CCl_4$ and 5% $O_2$.

8. The method of claim 5 wherein said boron trichloride and oxygen gas mixture comprises, by volume, 2–6% $O_2$ with the balance being $BCl_3$.

9. The method of claim 8 wherein said gas mixture comprises, by volume, 94% $BCl_3$ and 6% $O_2$.

10. The method for reactive ion etching predetermined patterns in thin films of aluminum and aluminum alloys comprising the steps of:
 (a) forming on a substrate a thin film of the aluminum or aluminum alloy to be patterned;
 (b) depositing a resist layer on said thin film to be patterned;
 (c) patterning said resist layer to define features therein and expose one or more areas of said thin film therebeneath;
 (d) mounting said substrate with said thin film thereon to be patterned on a cathode electrode within a reaction chamber;
 (e) using said patterned resist layer as a mask;
 (f) directionally etching, in said reaction chamber, the exposed areas of said thin film by steps which comprise:
  (i) introducing into said chamber at a flow rate of 30 to 50 sccm gas mixture comprising, by volume, 2–6% $O_2$, 15–25% $CCl_4$, with the balance being $BCl_3$;
  (ii) establishing a pressure within said chamber of 4 to 80 mtorr; and
  (iii) driving said cathode electrode via a radio-frequency generator, to establish a power density of approximately 0.25 watts per square centimeter at the surface of said substrate having said thin film and resist thereon; and
 (g) to selectively remove said exposed areas of said thin film thereby forming said predetermined pattern as the remaining unexposed areas of said thin film.

11. The method of claim 10 wherein said flow rate is about 40 sccm.

12. The method of claim 10 wherein said gas mixture comprises, by volume, 75% $BCl_3$, 20% $CCl_4$ and 5% $O_2$.

13. The method of claim 10 wherein said pressure is about 70 mtorr.

14. The method of claim 10 wherein said radio-frequency generator is operated at a frequency of about 13.56 MHz.

15. The method for reactive ion etching predetermined patterns in thin films of aluminum and aluminum alloys comprising the steps of:
 (a) forming on a substrate a thin film of the aluminum or aluminum alloy to be patterned;
 (b) depositing a resist layer on said thin film to be patterned;
 (c) patterning said resist layer to define features therein and expose one or more areas of said film therebeneath;
 (d) using said patterned resist layer as a mask, directionally etching, in a reaction chamber, for an etching time period, the exposed areas of said thin film with reactive species including ions from a first gas mixture comprising boron trichloride, carbon tetrachloride, and oxygen to selectively remove said exposed areas of said thin film thereby forming said predetermined pattern as the remaining unexposed areas of said thin film;
 (e) detecting an endpoint for the formation of said predetermined pattern by step (d); and
 (f) thereafter producing reactive species including ions from a second gas mixture comprising boron trichloride and oxygen and subjecting said pattern to an overetching time period of from 20 to 50% of said etching time period.

16. The method of claim 15 wherein said substrate with said thin film thereon to be patterned is mounted on a cathode electrode within said chamber and said directionally etching step comprises:
 (i) introducing into said chamber at a flow rate of about 30 to 50 sccm said gas mixture comprising, by volume, 2–6% $O_2$, 15–25% $CCl_4$, with the balance being $BCl_3$;
 (ii) establishing a pressure within said chamber of from about 60 to 80 mtorr;

(iii) by driving said cathode electrode via a radio-frequency generator, establishing a power density of approximately 0.25 watts per square centimeter at the surface of said substrate having said thin film and resist thereon; and, further, wherein step (f) is accomplished by shutting off the flow of said $CCl_4$ gas thereby causing the $BCl_3/O_2$ gas mixture to be introduced at a flow rate of from about 22 to 42 sccm.

17. The method of claim 16 wherein the flow rate of said $BCl_3/CCl_4/O_2$ gas mixture is about 40 sccm and the flow rate of said $BCl_3/O_2$ gas mixture is about 32 sccm.

18. The method of claim 16 wherein said first gas mixture comprises, by volume, 75% $BCl_3$, 20% $CCl_4$ and 5% $O_2$.

19. The method of claim 16 wherein said second gas mixture comprises, by volume, 94% $BCl_3$ and 6% $O_2$.

20. The method of claim 16 wherein said pressure is about 70 mtorr.

21. The method of claim 16 wherein said radio-frequency generator is operated at a frequency of about 13.56 MHz.

* * * * *